(12) United States Patent
Schmidhammer

(10) Patent No.: US 10,205,430 B2
(45) Date of Patent: Feb. 12, 2019

(54) RESONATOR CIRCUIT HAVING GREATER DEGREES OF FREEDOM, FILTER WITH IMPROVED TUNABILITY, AND DUPLEXER WITH IMPROVED TUNABILITY

(71) Applicant: Snaptrack Inc., San Diego, CA (US)

(72) Inventor: Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 62 days.

(21) Appl. No.: 15/315,372

(22) PCT Filed: May 28, 2015

(86) PCT No.: PCT/EP2015/061874
§ 371 (c)(1),
(2) Date: Nov. 30, 2016

(87) PCT Pub. No.: WO2016/000872
PCT Pub. Date: Jan. 7, 2016

(65) Prior Publication Data
US 2017/0155371 A1    Jun. 1, 2017

(30) Foreign Application Priority Data

Jul. 2, 2014   (DE) .................. 10 2014 109 264

(51) Int. Cl.
*H03H 7/01*    (2006.01)
*H03H 9/64*    (2006.01)
(Continued)

(52) U.S. Cl.
CPC .......... *H03H 7/0115* (2013.01); *H03H 7/463* (2013.01); *H03H 9/0538* (2013.01);
(Continued)

(58) Field of Classification Search
CPC ...... H03H 11/10; H03H 11/344; H03H 11/44; H03H 7/0115; H03H 7/463; H03H 9/0538;
(Continued)

(56) References Cited

U.S. PATENT DOCUMENTS 5,499,002 A    3/1996  Kinsman
7,683,741 B2 *  3/2010  Ito ..................... H03H 9/0542
                                                    331/116 R
(Continued)

FOREIGN PATENT DOCUMENTS

DE           141740 A1    5/1980
DE          4306512 A1    9/1994
(Continued)

OTHER PUBLICATIONS

Machine English Translation of DE4306512 A1 Published on Sep. 8, 1994.*
(Continued)

*Primary Examiner* — Robert J Pascal
*Assistant Examiner* — Jorge L Salazar, Jr.
(74) *Attorney, Agent, or Firm* — Patterson & Sheridan, L.L.P.

(57) ABSTRACT

A resonator circuit, a filter with improved tunability, and a duplexer with improved tunability are disclosed. In an embodiment, the resonator circuit includes a resonator, a Z transformer and an impedance circuit, wherein the impedance circuit has an impedance Z and includes an impedance element, wherein the Z transformer is interconnected between the resonator and the impedance circuit, and wherein the Z transformer transforms the impedance Z to a new impedance Z'≠Z and comprises a transformation circuit selected from: a generalized impedance converter (GIC), an negative impedance converter (NIC), a generalized imped-
(Continued)

ance inverter (GII) and an negative impedance inverter (NII).

13 Claims, 5 Drawing Sheets

(51) Int. Cl.
 *H03H 11/34* (2006.01)
 *H03H 9/05* (2006.01)
 *H03H 9/54* (2006.01)
 *H03H 11/10* (2006.01)
 *H03H 7/46* (2006.01)
 *H03H 9/24* (2006.01)
 *H03H 9/25* (2006.01)
 *H03H 9/46* (2006.01)
 *H03H 9/70* (2006.01)
 *H03H 9/72* (2006.01)
 *H03H 11/44* (2006.01)

(52) U.S. Cl.
 CPC ............ *H03H 9/2405* (2013.01); *H03H 9/25* (2013.01); *H03H 9/462* (2013.01); *H03H 9/545* (2013.01); *H03H 9/64* (2013.01); *H03H 9/706* (2013.01); *H03H 9/725* (2013.01); *H03H 11/10* (2013.01); *H03H 11/344* (2013.01); *H03H 11/44* (2013.01)

(58) Field of Classification Search
 CPC ........ H03H 9/2405; H03H 9/25; H03H 9/462; H03H 9/545; H03H 9/64; H03H 9/706; H03H 9/725
 USPC .................... 333/133, 186, 187, 193–196
 See application file for complete search history.

(56) References Cited

U.S. PATENT DOCUMENTS

| | | |
|---|---|---|
| 2005/0012571 A1 | 1/2005 | Song et al. |
| 2009/0115552 A1 | 5/2009 | Ito et al. |
| 2009/0230486 A1 | 9/2009 | Shimodaira |
| 2011/0090026 A1 | 4/2011 | Nakahashi et al. |
| 2011/0193656 A1 | 8/2011 | Erb et al. |
| 2013/0127565 A1* | 5/2013 | Nishihara .......... H03H 9/02102 333/133 |

FOREIGN PATENT DOCUMENTS

| | | |
|---|---|---|
| EP | 0375570 A2 | 6/1990 |
| EP | 1482638 A2 | 12/2004 |
| JP | H0974325 A | 3/1997 |
| JP | 2004357306 A | 12/2004 |
| JP | 2013070143 A | 4/2013 |
| SU | 604133 A1 | 4/1978 |
| WO | 2010001522 A1 | 1/2010 |
| WO | 2011100014 A2 | 8/2011 |

OTHER PUBLICATIONS

Hassan, M.E. et al., "A New Method to Reconfigure BAW-SMR Filters Using CMOS Transistors," 2007 IEEE, IXL Microelectronics Laboratory—UMR 5818 CNRS-ENSEIRB—University of Bordeaux, 2007, 4 pages.

Linvill, J.G., "Transistor Negative-Impedence Converters," Proceedings of the I.R.E., Jun. 1953, 5 pages.

Merrill, Jr. J.L., "Theory of the Negative Impedance Converter," Bell Labs, 1950, 22 pages.

Sussman-Fort, S.E., "Non-Foster Impedance Matching of Electrically-Small Antennas," IEEE Transactions on Antennas and Propagation, vol. 57, No. 8, Aug. 2009, 12 pages.

Sussman-Fort, S.E., "Matching Network Design Using Non-Foster Impedances," International Journal of Rf and Microwave Computer-Aided Engineering, vol. 16, No. 2, 2006, 43 pages.

Sussman-Fort, S.E., "Gyrator-Based Biquad Filters and Negative Impedance Converters for Microwaves," Int. RF Microw, Comput.-Aided Engr., (Special Issue on Net. Synthesis Method. Microw. Dev.), vol. 8, No. 3, Mar. 1998, 16 pages.

Yanagisawa, T., "RC Active Networks Using Current Inversion Type Negative Impedance Converters," IRE Transactions on Circuit Theory, Sep. 1957, 5 pages.

International Search Report and Written Opinion—PCT/EP2015/061874—ISA/EPO—dated Aug. 17, 2015.

* cited by examiner

RESONATOR CIRCUIT HAVING GREATER DEGREES OF FREEDOM, FILTER WITH IMPROVED TUNABILITY, AND DUPLEXER WITH IMPROVED TUNABILITY

This patent application is a national phase filing under section 371 of PCT/EP2015/061874, filed May 28, 2015, which claims the priority of German patent application 10 2014 109 264.3, filed Jul. 2, 2014, each of which is incorporated herein by reference in its entirety.

TECHNICAL FIELD

The invention relates to resonator circuits, filters and duplexers which are distinguished by an improved tunability, and to the use of duplexers.

BACKGROUND

In RF filters which may be contained, e.g., in duplexers, resonators are generally used. The resonators generally have a specific resonant frequency $\omega_0$ and a specific antiresonant frequency $\omega_p$, at which the impedance of the resonator forms a pole. These two frequencies have a great influence on characteristic filter properties. If resonators are interconnected, e.g., to form bandpass filters, then said frequencies determine the position and width of the passband. Conventional resonators therefore have a limited area of application with regard to their operating frequencies.

Further parameters that determine resonators and hence filters are the power compatibility and the extent to which the filters operate in a sufficiently linear range.

SUMMARY OF THE INVENTION

Therefore, there is a demand for resonator circuits which, in comparison with known resonator circuits, have further degrees of freedom in order to obtain a specific frequency characteristic. In particular, it is desirable to have more latitude in setting characteristic frequencies and higher power strengths.

The resonator circuit as further described herein meets these requirements and thereby enables improved filters and duplexers.

The resonator circuit comprises a resonator, a Z transformer and an impedance circuit. The impedance circuit has an impedance Z and includes an impedance element. The Z transformer is interconnected between the resonator and the impedance circuit. The Z transformer transforms the impedance Z of the impedance circuit to a new impedance $Z' \approx Z$ and comprises a transformation circuit selected from a GIC, an NIC, a GII and an NII.

In this case, a GIC (Generalized Impedance Converter) is a transformation circuit which converts an initial impedance Z into a new impedance Z', wherein the new impedance Z' is substantially proportional to the initial impedance Z. A GII (Generalized Impedance Inverter) is substantially a transformation circuit which transforms an initial impedance Z to a new impedance Z', wherein the new impedance Z' is substantially proportional to the reciprocal value of the original impedance Z. An NIC (Negative Impedance Converter) is a GIC, wherein the proportionality factor is negative. An NII (Negative Impedance Inverter) is a GII, wherein the proportionality factor is negative.

In principle, the Z transformer is thus a transformation circuit which causes an original impedance Z to appear as though it were a different impedance Z'. In other words: the Z transformer masks an original impedance Z and makes a transformed impedance Z' available to a further circuit environment, even though only an impedance Z is present behind the Z transformer.

In this case, the Z transformer can comprise a two-port network. A two-port network is an electrical circuit having an input port and an output port. Each of the two ports comprises two electrical terminals. The electrical behavior of a two-port network is substantially determined by how the voltages present at the two ports and the currents flowing into each port and out of each port are related to one another. If the currents and the voltages of the two ports are summarized as components of matrices, then two-port networks may also be able to be described in a compact notation by matrices:

$$\begin{pmatrix} U_{IN} \\ I_{IN} \end{pmatrix} = \begin{pmatrix} A & B \\ C & D \end{pmatrix} \begin{pmatrix} U_L \\ I_L \end{pmatrix} \quad (1)$$

In this case, $U_{IN}$ denotes the voltage at the input port, $I_{IN}$ denotes the current flowing into the first port, $U_L$ denotes the voltage at the output port, and $I_L$ denotes the current intensity at the output port. An electrical load is usually interconnected at the output port of the two-port network, such that the voltage and the current are correspondingly identified by the index L.

The impedance is defined as the quotient of voltage and current:

$$Z = \frac{U}{I} \quad (2)$$

From equations (1) and (2), $Z_{IN}$ thus results as:

$$Z_{IN} = \frac{AZ_L + B}{CZ_L + D}. \quad (3)$$

In this case, $Z_{IN}$ is the impedance at the input port and $Z_L$ is the impedance at the output port of the Z transformer.

The matrix having the entries ABCD is called a chain matrix. If the diagonal elements of the chain matrix, that is to say A and D, are equal to 0:

$$\begin{pmatrix} A & B \\ C & D \end{pmatrix}_{GII} = \begin{pmatrix} 0 & B \\ C & 0 \end{pmatrix}, \quad (4)$$

then the impedance at the input of the Z transformer results as:

$$Z_{IN} = \frac{B}{CZ_L}. \quad (5)$$

The impedance $Z_L$ is thus transformed to a new impedance $Z_{IN}$, wherein the original impedance $Z_L$ and the new impedance $Z_{IN}$ are reciprocal. The proportionality factor is B/C. A chain matrix having vanishing diagonal elements thus describes a GII.

If only the diagonal elements of the chain matrix, namely A and D, are different than 0:

$$\begin{pmatrix} A & B \\ C & D \end{pmatrix}_{GIC} = \begin{pmatrix} A & 0 \\ 0 & D \end{pmatrix}, \quad (6)$$

then an impedance $Z_L$ is transformed to the new impedance:

$$Z_{IN} = \frac{AZ_L}{D} \quad (7)$$

In this case, the new impedance $Z_{IN}$ is proportional to the initial impedance $Z_L$, wherein the quotient A/D is the proportionality factor. The original impedance and the new impedance are thus proportional, for which reason equation (6) describes a GIC.

If the diagonal elements of the chain matrix of a GIC have different signs:

$$\begin{pmatrix} A & B \\ C & D \end{pmatrix}_{NIC} = \begin{pmatrix} 1 & 0 \\ 0 & -k_i \end{pmatrix} \quad (8)$$

or $$\begin{pmatrix} A & B \\ C & D \end{pmatrix}_{NIC} = \begin{pmatrix} -k_{ij} & 0 \\ 0 & 1 \end{pmatrix} \quad (9)$$

then the original impedance $Z_L$ and the new impedance $Z_{in}$ have different signs:

$$Z_{IN} = -kZ_L; k = k_{ij} = \frac{1}{k_i} > 0. \quad (10)$$

The significance of the Z transformer thus consists in transforming an original impedance $Z_L$ into an impedance $Z_{IN}$=Z', which in interaction with the resonator produces a resonator circuit which has new properties in comparison with previously known resonator circuits and thus enables improved filters and circuits comprising such filters, e.g., duplexers. The Z transformer thus essentially makes it possible to synthesize a new impedance Z', wherein creating said impedance Z' in a conventional way—if possible at all—would mean a very great outlay on circuitry.

Particularly if a tunable impedance element is chosen as impedance element of the impedance circuit and a tunable impedance range Z is obtained in this case, then the flexibility in defining the tuning range of the transformed impedance Z' is extremely high. Depending on the choice of the chain matrix, virtually any desired properties of the resonator circuit can be obtained.

It is possible for the resonator to be an SAW resonator (SAW=Surface Acoustic Wave), a BAW resonator (BAW=Bulk Acoustic Wave), a MEMS resonator (MEMS=Micro Electro Mechanical System) or an LC resonant circuit. A form of a resonator operating with acoustic waves which combines properties of SAW resonators and BAW resonators, a GBAW resonator (GBAW=Guided Bulk Acoustic Wave), is likewise possible. The resonator circuit is not restricted to a specific embodiment of a resonator, for which reason any resonator which operates with electrical signals may be appropriate, in principle.

In the case of a resonator operating with acoustic waves in which, by means of electrode structures, an acoustic wave is generated at the surface or in the bulk of a piezoelectric material, this has an equivalent circuit diagram having two capacitances and an inductance. A series interconnection of an inductive element having the inductance $L_1$ and a capacitive element having the capacitance $C_1$ is interconnected in parallel with a capacitive element having the capacitance $C_0$. In this case, such a resonator operating with acoustic waves substantially has a resonant frequency at $$\omega_0 = \sqrt{\frac{1}{L_1 C_1}} \quad (11)$$

In this case, the resonant frequency depends on the values of the inductance and the first capacitance $C_1$.

The antiresonant frequency is given by:

$$\omega_P = \omega_0 \sqrt{1 + \frac{C_1}{C_0}} \quad (12)$$

and additionally also depends on the capacitance $C_0$ of the parallel capacitive element. In this case, the frequency spacing between the pole and the resonant frequency is substantially a measure of the bandwidth of a corresponding bandpass filter. The resonant frequency is independent of the capacitance $C_0$. However, the frequency of the pole is dependent on $C_0$. This means that the bandwidth of a corresponding filter can easily be set by altering said capacitance $C_0$. By interconnecting the resonator with the impedance circuit via the Z transformer, it is possible to obtain an equivalent circuit diagram of a resonator in which the individual impedance and/or capacitance elements can be set significantly more flexibly. Compared with conventional resonators, therefore, the present resonator circuit affords further degrees of freedom in setting the resonant frequency and in setting the antiresonant frequency.

It is possible for the transformation circuit of the Z transformer to be an NIC. As a result, an original impedance Z is inverted and has a negative proportionality factor applied thereto. An interconnection of a corresponding transformation circuit and a capacitive element, for example, produces a circuit having a negative capacitance. If the parallel capacitance $C_0$ of a resonator operating with acoustic waves constitutes a problem because the linearity of the resonator is reduced thereby, then it is possible to obtain a resonator circuit having an equivalent circuit diagram in which the parallel capacitance $C_0$ is reduced. In this case, the parallel capacitance $C_0$ of the actual resonator depends on the geometrical dimensions thereof. These dimensions also determine, inter alia, the mechanical properties of the resonator, such that they cannot be varied arbitrarily during the development of a filter circuit. However, compensation can nevertheless be obtained as a result of the interconnection with the impedance element via the Z transformer.

It is possible for the impedance element to be tunable.

Particularly since the resonant frequency is not dependent on the parallel capacitance $C_0$, setting this capacitance can easily vary the bandwidth since setting merely effects the antiresonant frequency. Via the proportionality factor, a large tuning range of the corresponding filter can thus be obtained even with a small setting range of the impedance element.

It is therefore possible, in particular, for the impedance element to be a capacitive element. A capacitive element as impedance element in interaction with an NII or an NIC allows a reduction of the parallel capacitance $C_0$ in the equivalent circuit diagram of the resonator.

It is furthermore possible for the impedance element to be a DTC (Digitally Tunable Capacitor). In the case thereof, a multiplicity of individual capacitors can be combined in a matrix and be supplementary connectable individually to the overall circuit, such that the total capacitance of the impedance element is easily settable. If a corresponding filter is used in a mobile communication device, then customary bus systems, e.g., MIPI, can be provided for driving said impedance element. However, the use of an impedance element having tunable impedance is not restricted to a DTC. Other tunable impedance elements such as, e.g., varactors or elements based on BST (Barium-Strontium-Titanate) are likewise possible. An interconnection of these variable-capacitance elements for forming the impedance element having tunable impedance is also possible.

It is possible for the resonator, the Z transformer and the impedance circuit to be arranged on a common carrier, e.g., a common carrier substrate. Such an arrangement enables a compact integration, which complies with the prevailing ongoing trend toward miniaturization.

It is furthermore possible for the Z transformer and/or the impedance circuit to be manufactured using CMOS technology (CMOS=Complementary Metal Oxide Semiconductor) or using a technology based on GaAs (gallium arsenide) or SiGe (silicon-germanium).

It is furthermore possible for the Z transformer and/or the impedance circuit to be formed in a semiconductor substrate. The resonator is formed in or on a resonator substrate. The resonator substrate and the semiconductor substrate are stacked. In this case, the resonator substrate can be arranged on or below the semiconductor substrate.

Furthermore, it is possible for such a resonator circuit to be part of an RF filter. In this case, e.g., so-called ladder type structures are appropriate as RF filter. Such structures enable bandpass filters or band-stop filters.

Filter topologies are likewise conceivable which are equipped exclusively with resonator circuits in a shunt branch relative to ground. These are coupled via serial impedance elements, e.g., inductive and/or capacitive elements. Furthermore, filter topologies are conceivable which are equipped exclusively with resonator circuits in the signal path. These are then coupled via parallel impedance elements, e.g., inductive and/or capacitive elements, which are connected to ground.

It is possible for a duplexer, e.g., a duplexer provided for use in a mobile communication device, to comprise such an RF filter as transmission filter and/or as reception filter.

Furthermore, it is possible to use such a duplexer in a communication device, wherein the duplexer comprises a tunable impedance element as impedance element and is therefore tunable in terms of its frequency properties.

BRIEF DESCRIPTION OF THE DRAWINGS

Important aspects and principles of the resonator circuit are explained in greater detail below with reference to schematic figures.

In the figures.

DETAILED DESCRIPTION OF ILLUSTRATIVE EMBODIMENTS

Figure 1:
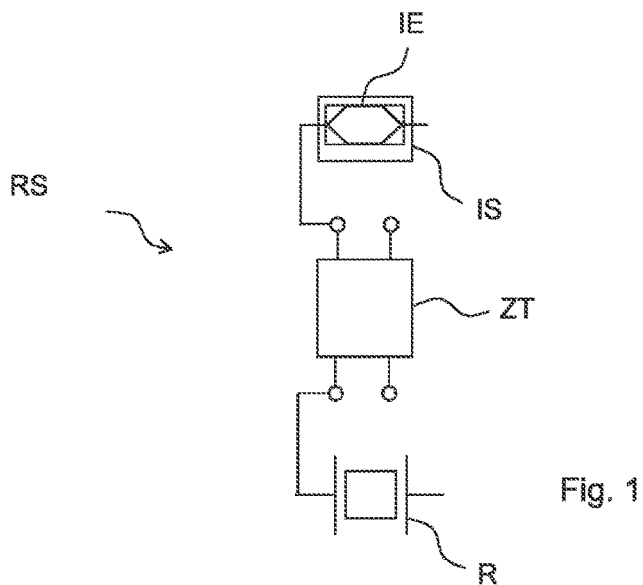
FIG. 1 shows a schematic illustration of the resonator circuit RS.

FIG. 1 schematically illustrates the relationship of the individual circuit component parts of the resonator circuit RS. The resonator circuit RS comprises a resonator R, a Z transformer ZT and an impedance circuit IS. The impedance circuit has an impedance Z and comprises an impedance element IE. The impedance element IE can determine the impedance Z of the impedance circuit IS by itself or in interaction with further circuit component parts of the impedance circuit IS. The Z transformer ZT is interconnected between the resonator R and the impedance circuit IS. As a result, it is possible for the Z transformer ZT to mask the impedance Z of the impedance circuit IS and to cause it to appear as an alternative impedance Z' toward the outside, i.e., toward the resonator. Depending on the choice of the matrix elements of the chain matrix of the Z transformer, the original impedance Z of the impedance circuit IS can appear as practically any arbitrary impedance Z'. In particular capacitances having a negative capacity are possible. The coupling of the resonator R with a fundamentally arbitrarily transformed impedance Z' enables degrees of freedom which, by means of conventional impedance circuits IS, do not become accessible at all or become accessible at most with a high outlay on circuitry.

Since the combination of the three circuit component parts of the resonator circuit IS has a multiplicity of electrical terminals, it is possible in a diverse manner to connect precisely this resonator circuit to an external circuit environment, e.g., a bandpass circuit.

Figure 2:
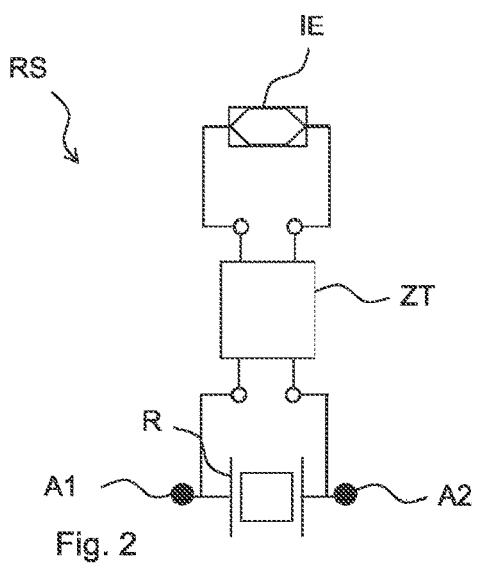
FIG. 2 shows one embodiment of a resonator circuit.

FIG. 2 shows an embodiment of the resonator circuit in which the Z transformer ZT is embodied as a two-port network interconnected with the resonator R by one port and with an impedance element IE of the impedance circuit IS by the other port. In this case, the resonator circuit RS has a first terminal A1 and a second terminal A2, via which it can be interconnected with an external circuit environment.

FIG. 2 illustrates here a parallel interconnection of the resonator R with the new impedance Z' that results from the use of the Z transformer ZT between the resonator R and the impedance element IE.

Figure 3:
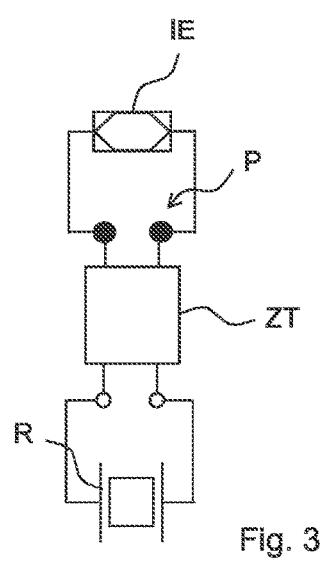
FIG. 3 shows a further embodiment of the resonator circuit.

FIG. 3 shows an embodiment of the resonator circuit in which the terminals of the resonator circuit are assigned to the port P facing the impedance element IE.

Figure 4:
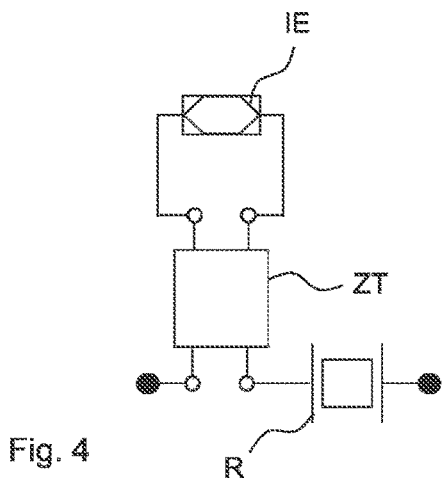
FIG. 4 shows a further embodiment of the resonator circuit.

FIG. 4 shows an embodiment of the resonator circuit in which the resonator R and the new impedance Z' are connected in series between the terminals for an external circuit environment.

Figure 5:
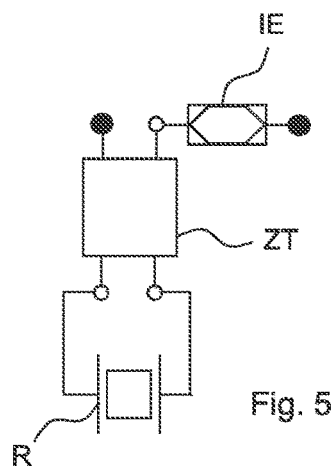
FIG. 5 shows a further configurational form of the resonator circuit.

FIG. 5 illustrates a resonator circuit in which the terminals for an external circuit environment are provided directly on the one hand with the impedance element and on the other hand with a terminal of a port of the Z transformer that faces the impedance element.

Figure 6:
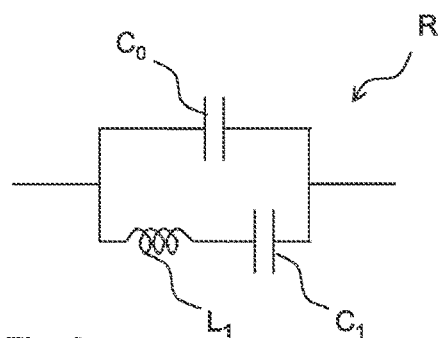
FIG. 6 shows the equivalent circuit diagram of a resonator R operating with acoustic waves.

FIG. 6 illustrates the equivalent circuit diagram of a resonator R operating with acoustic waves. A series interconnection of an inductance $L_1$ and a first capacitance $C_1$ is interconnected in parallel with a capacitive element of the capacitance $C_0$. In this case, the capacitance $C_0$ influences the position of the pole, but not the position of the resonant frequency of the resonator.

A connection of the resonator R to an impedance element IE via a Z transformer ZT makes it possible, depending on matrix elements of the chain matrix, to have practically any desired influence on the variables $L_1$, $C_1$ and $C_0$.

Figure 7:
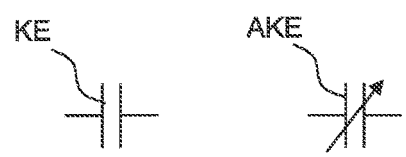
FIG. 7 shows various possibilities for the impedance element in the impedance circuit.
Figure 7:
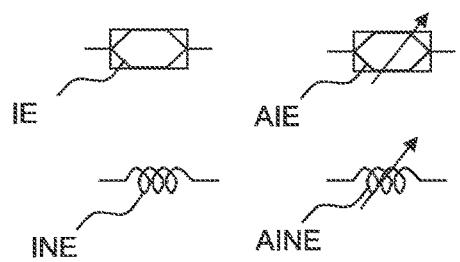

FIG. 7 shows various embodiments of the impedance element IE in the impedance circuit IS. The impedance element can be a capacitive element KE (shown at top left), a tunable capacitive element AKE (shown at top right), an inductive element INE (shown at bottom left), a tunable inductive element AINE (shown at bottom right), or generally an inductive element IE (middle, left) or a tunable inductive element AIE (middle, right). Interconnections of different tunable or non-tunable impedance elements in the impedance circuit IS are likewise possible.

The impedance element can itself have a circuit composed of elementary circuit units such as active or passive units.

Figure 8:
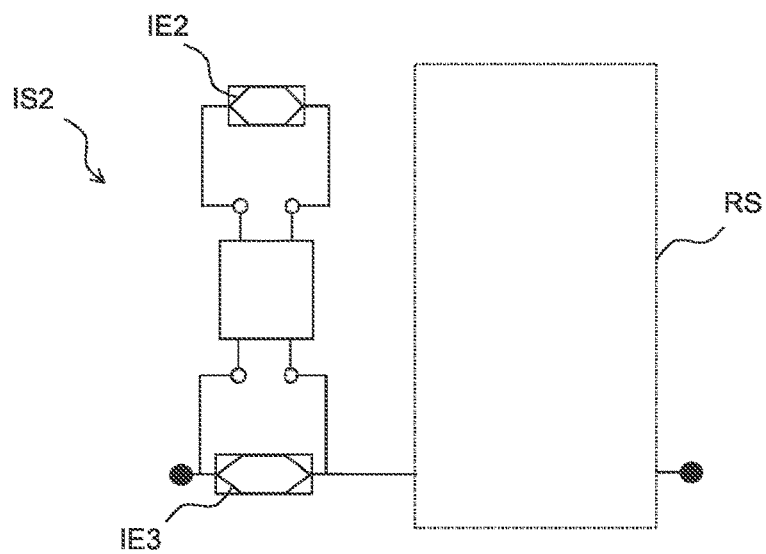
FIG. 8 shows an extension of the resonator circuit in order to obtain additional degrees of freedom.

FIG. 8 shows the possibility of further manipulating the resonator circuit RS or the frequency-dependent impedance behavior thereof by an interconnection with further circuit component parts, in order to obtain even more degrees of freedom. In this regard, the resonator circuit RS can be interconnected in series with a third impedance element IE3. A second impedance element IE2 can be coupled to the third impedance element IE3 via a further Z transformer, such that the impedance of the second impedance element is also settable practically arbitrarily toward the outside. The circuit interconnected with the resonator circuit RS thus constitutes a further impedance circuit IS2. A serial interconnection of the further impedance circuit IS2 and the resonator circuit RS is thus made available via the terminals for an external circuit environment.

Generally, each resonator circuit RS in FIG. 1, 2, 3, 4 or 5 can also be interconnected with each resonator circuit RS in FIG. 1, 2, 3, 4 or 5 in this way.

Figure 9:
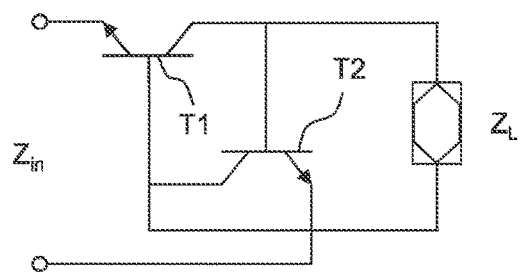
FIG. 9 shows one embodiment of an NIC.

FIG. 9 shows one possible embodiment of a GIC, specifically of an NIC, which embodiment is very simple, however, for the sake of clarity: an impedance element of the impedance $Z_L$ is interconnected with the input port of the NIC via two cross-connected transistors and appears as impedance $Z_{IN}$. The emitter of the upper transistor T1 is interconnected with one terminal of the port. The emitter of the lower transistor T2 is interconnected with the second terminal of the port. The base of the first transistor T1 is interconnected with the "lower" terminal of the impedance element. The base of the second transistor T2 is interconnected with the "upper" terminal of the impedance element. Since the base of the first transistor T1 is additionally interconnected with the collector of the second transistor and the base of the second transistor is interconnected with the collector of the first transistor, a "crosswise" interconnection is obtained.

Applying Kirchhoff's laws—considered in suitable conductor loops for voltages and at suitable circuit nodes for currents—leads to the result that the voltages present at the impedance element, on the one hand, and at the input port of the NIC, on the other hand, are identical in terms of absolute value, but of different polarities if both transistors are of the same design. If a sinusoidal RF signal is applied to the circuit in FIG. 9, then this results in a phase shift of 180 degrees between the input of the circuit and the load. However, the current flow is identical in this case. $Z_{IN}=-Z_L$ thus ensues from equation 2. Therefore, an NIC having a proportionality factor=−1 is actually present, which transforms an arbitrary load impedance $Z_L$ into the negative impedance $Z'=-Z_L$.

The behavior of the Z transformer is determined by the matrix entries A, B, C, D. At first glance it appears to be difficult to find a corresponding circuit which realizes the matrix for selected values for A, B, C and D. However, the advantage of matrix notation is manifested here: two series-connected two-port networks are described by a common matrix that results as the product of the two individual matrices of the two individual two-port networks. A technical solution for the chain matrix has therefore already been found if technical solutions are found for a multiplicity of two-port networks whose matrix product yields the desired chain matrix. The problem can thus easily be found by decomposing into partial problems and solving these partial problems independently of one another.

For reasons of stability, it may be advantageous to use a plurality of transistors.

NICs realized with transistors are known, e.g., from the paper "Transistor Negative-Impedance Converters" by J. G. Linvill; Proceedings I; R; E June 1953, pp. 725-729.

Figure 10:
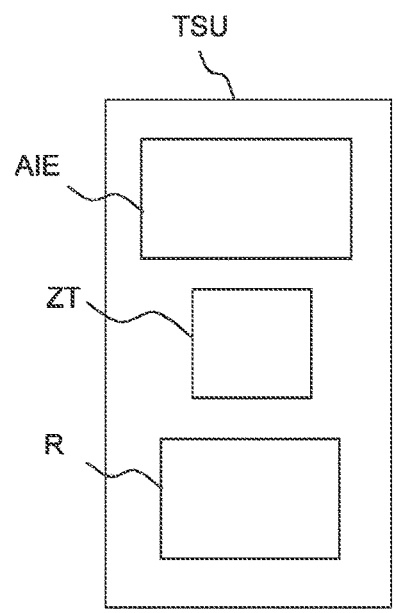
FIG. 10 shows one possible arrangement of the circuit components on a carrier substrate TSU.

FIG. 10 shows one possible arrangement of the circuit component parts on a carrier substrate TSU. The resonator R, the Z transformer ZT and the impedance element, e.g., a tunable impedance element AIE, can be arranged alongside one another on the carrier substrate TSU. Interconnections are possible via metallization on the surface of the carrier substrate TSU or in interlayers of a carrier substrate embodied in a multilayered fashion.

Figure 11:
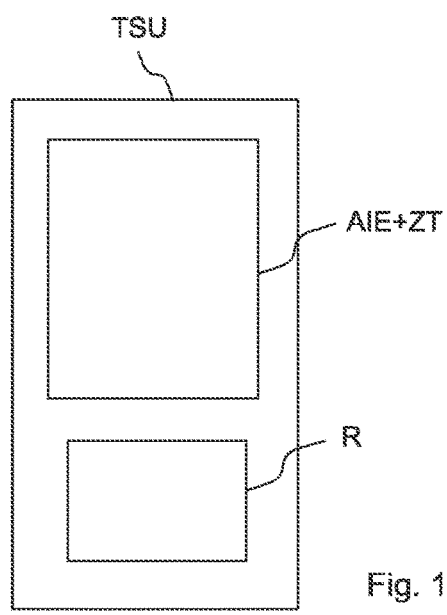
FIG. 11 shows a further possibility of the arrangement with a higher degree of integration.

FIG. 11 shows a further degree of integration in which the tunable impedance element AIE and the circuit elements of the Z transformer ZT are integrated together, e.g., in a semiconductor chip.

Figure 12:
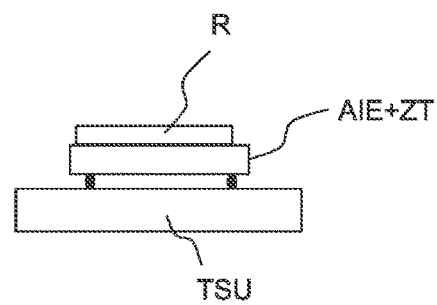
FIG. 12 shows a cross section through a component which represents a further possibility for the arrangement with a higher degree of integration.

FIG. 12 shows a cross section through a component in which a component part comprising the tunable impedance element AIE and the Z transformer is arranged on a carrier substrate. The interconnection therebetween can be produced by means of bumps.

A component part comprising the resonator is arranged on the component part comprising the tunable impedance element and the Z transformer. The interconnection of these component parts can also be effected by means of bumps. An interconnection via TSVs (TSV=Thru-Silicon Via) is likewise possible.

Figure 13:
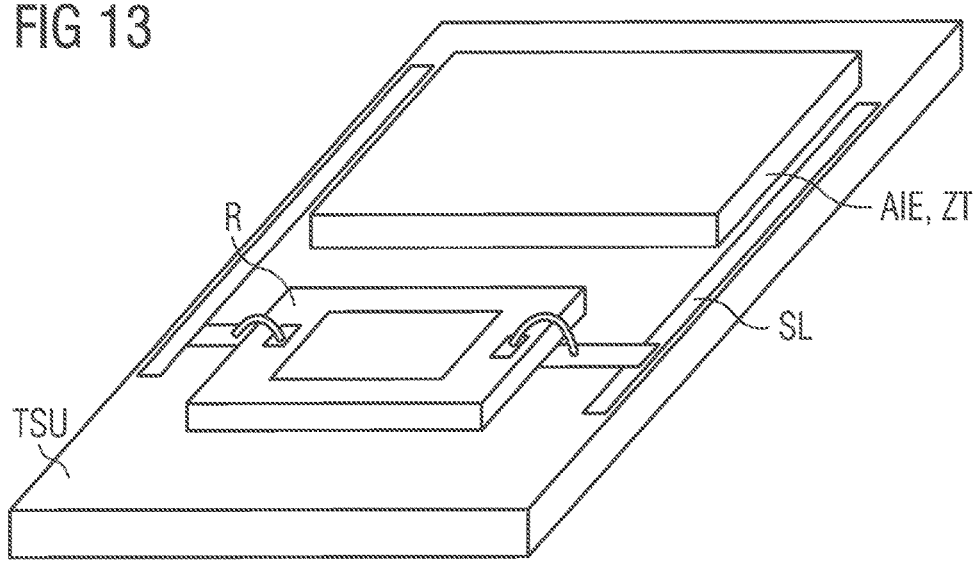
FIG. 13 shows a perspective view of a component in which circuit component parts are arranged on a carrier substrate TSU and interconnected by means of bonding wire.

FIG. 13 shows such a possibility in a perspective view, wherein signal lines as structured metallizations are arranged on the surface of the carrier substrate TSU. Terminals of the resonator R are connected to the metallizations of the signal line SL by bond wires BD.

Figure 14:
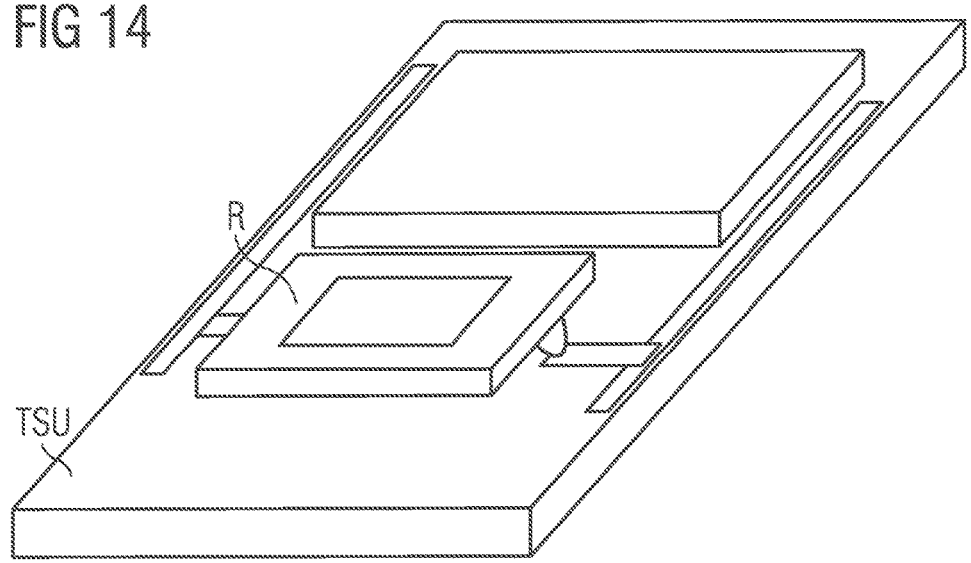
FIG. 14 shows a further embodiment with provision of an interconnection by means of bump connection BU.

FIG. 14 shows an alternative or additional embodiment, in which the resonator R is interconnected with the metallizations of the signal line by means of bump connections BU.

Figure 15:
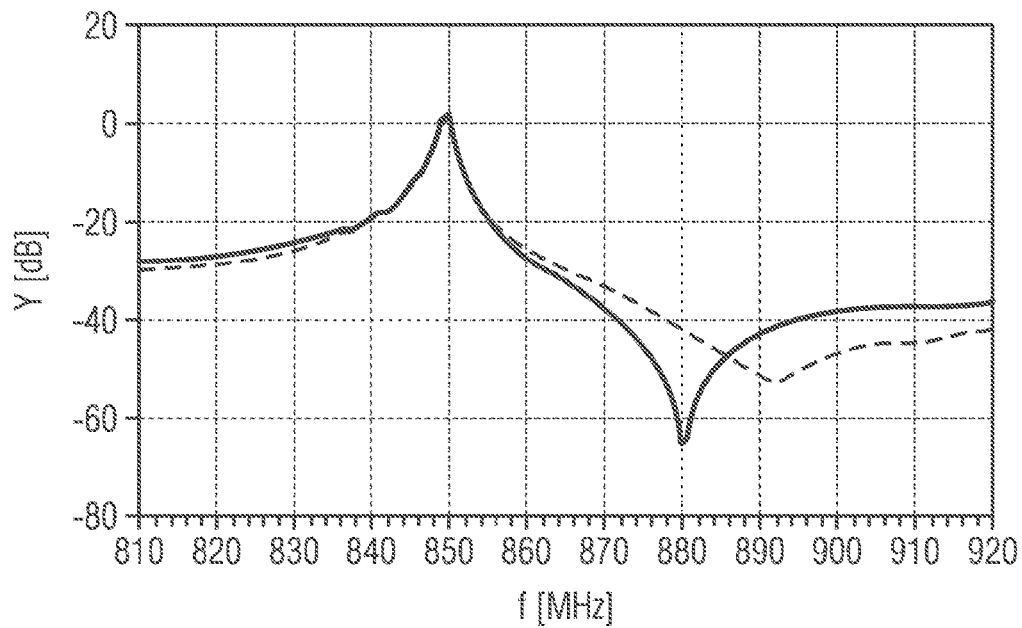
FIG. 15 shows admittance curves of an exemplary resonator circuit.

FIG. 15 shows frequency-dependent admittance curves Y for a resonator circuit in which the impedance element is embodied as a tunable impedance element. In this case, the tunable impedance element is interconnected with a conventional SAW resonator via an NIC (see, e.g., FIG. 2). Tuning the impedance Z of the impedance element, i.e., varying the impedance Z of the impedance element, does not vary the resonant frequency, which is approximately 880 MHz. The two curves shown in FIG. 15 result depending on the value of the impedance of the tunable impedance element. The pole is at approximately 880 MHz in one case, and at approximately 895 MHz in the other case. That corresponds to an increase in the pole-zero spacing from 30 MHz to 45 MHz and enables an increase in the (relative) bandwidth by 50 percent.

Figure 16:
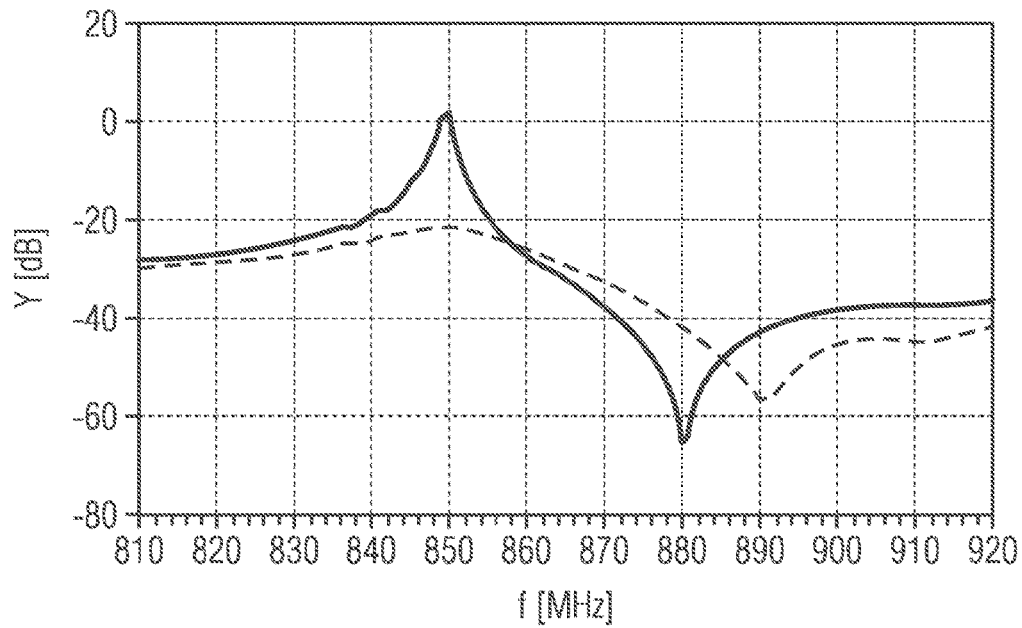
FIG. 16 shows admittance curves of an alternative embodiment of a resonator circuit.

FIG. 16 shows frequency-dependent admittance curves of a resonator circuit in which the impedance element in the sense of FIG. 3 is directly connected to the terminals of the resonator circuit and the NIC masks the impedance of the resonator R. Here, too, a readily variable antiresonance is settable. The quality factor of the antiresonance is still relatively good.

By contrast, the quality factor of the resonance is detrimentally affected. However, better quality factors can be improved by correspondingly carefully selected circuit component parts.

Further resonator circuits comprising additional resonators, transformers and impedance elements and corresponding filter circuits and duplexers are possible besides the above-described circuits and exemplary embodiments shown in the figures.

The invention claimed is:

1. A resonator circuit comprising:
   a resonator;
   an impedance transformer; and
   an impedance circuit configured to adjust a frequency spacing between a pole and a resonant frequency of the resonator circuit,
   wherein the impedance circuit has a first impedance and includes an impedance element,
   wherein the impedance transformer is interconnected between the resonator and the impedance circuit, and
   wherein the impedance transformer is configured to transform the first impedance to a second impedance different from the first impedance and comprises a transformation circuit selected from: a generalized impedance converter (GIC), an negative impedance converter (NIC), a generalized impedance inverter (GII) and a negative impedance inverter (NII).

2. The resonator circuit according to claim 1, wherein the resonator comprises at least one of a surface acoustic wave (SAW) resonator, a bulk acoustic wave (BAW) resonator, a microelectromechanical system (MEMS) resonator, or an LC resonant circuit.

3. The resonator circuit according to claim 1, wherein the transformation circuit is the NIC and comprises two cross-connected transistors.

4. The resonator circuit according to claim 1, wherein the impedance element is tunable.

5. The resonator circuit according to claim 1, wherein the impedance element is a capacitive element.

6. The resonator circuit according to claim 1, wherein the impedance element comprises a digitally tunable capacitor (DTC), a varactor, or a barium-strontium-titanate (BST)-based element.

7. The resonator circuit according to claim 1, wherein the resonator, the impedance transformer and the impedance circuit are arranged on a common carrier.

8. The resonator circuit according to claim 1, wherein at least one of the impedance transformer or the impedance circuit is manufactured using CMOS technology or using a technology based on GaAs or SiGe.

9. The resonator circuit according to claim 1, wherein:
   at least one of the impedance transformer or the impedance circuit is formed in a semiconductor substrate,
   the resonator is formed in or on a resonator substrate, and
   the resonator substrate and the semiconductor substrate are stacked.

10. A radio frequency (RF) filter comprising:
    one or more resonator circuits according to claim 1.

11. The RF filter according to claim 10, wherein the one or more resonator circuits are interconnected either exclusively in a signal path or exclusively in one or more shunt paths which interconnect the signal path with ground.

12. A duplexer comprising:
    the RF filter according to claim 10.

13. The duplexer according to claim 12, wherein the duplexer comprises a tunable impedance element as the impedance element such that the duplexer is tunable in terms of its frequency properties.

* * * * *